United States Patent
Shibuya et al.

(10) Patent No.: US 9,294,066 B2
(45) Date of Patent: Mar. 22, 2016

(54) TRANSMISSION DEVICE (71) Applicants: Koji Shibuya, Chiyoda-ku (JP); Hideyuki Ohashi, Chiyoda-ku (JP)

(72) Inventors: Koji Shibuya, Chiyoda-ku (JP); Hideyuki Ohashi, Chiyoda-ku (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 178 days.

(21) Appl. No.: 14/235,964

(22) PCT Filed: Dec. 19, 2012

(86) PCT No.: PCT/JP2012/082929
§ 371 (c)(1),
(2) Date: Jan. 29, 2014

(87) PCT Pub. No.: WO2013/105405
PCT Pub. Date: Jul. 18, 2013

(65) Prior Publication Data
US 2014/0167875 A1    Jun. 19, 2014

(30) Foreign Application Priority Data
Jan. 10, 2012   (JP) .................................. 2012-002310

(51) Int. Cl.
*H03H 7/38*    (2006.01)
*H04B 3/30*    (2006.01)
*H04L 25/02*   (2006.01)

(52) U.S. Cl.
CPC . *H03H 7/38* (2013.01); *H04B 3/30* (2013.01); *H04L 25/0272* (2013.01); *H04L 25/0278* (2013.01); *H04L 25/0276* (2013.01)

(58) Field of Classification Search
CPC ....................................... H03H 7/38
USPC .......................................... 333/33
See application file for complete search history.

(56) References Cited

U.S. PATENT DOCUMENTS

| | | | | |
|---|---|---|---|---|
| 4,677,388 A | * | 6/1987 | Morrison | ............. H04N 5/08 327/334 |
| 6,791,429 B2 | * | 9/2004 | Mikalauskas | ...... G01R 31/2853 333/1 |
| 6,801,071 B1 | | 10/2004 | Shizuki | |
| 2004/0212404 A1 | | 10/2004 | Shizuki | |
| 2004/0233704 A1 | | 11/2004 | Shizuki | |

FOREIGN PATENT DOCUMENTS

| | | |
|---|---|---|
| JP | 5-37209 | 2/1993 |
| JP | 2004-327797 | 11/2004 |
| JP | 2010-206084 | 9/2010 |

OTHER PUBLICATIONS

International Search Report issued Jan. 29, 2013, in PCT/JP12/082929 filed Dec. 19, 2012.
Extended European Search Report issued Sep. 9, 2015 in Patent Application No. 12864962.1.

* cited by examiner

*Primary Examiner* — Stephen E Jones
(74) *Attorney, Agent, or Firm* — Oblon, McClelland, Maier & Neustadt, L.L.P.

(57) ABSTRACT

A transmission device that establishes efficient match with an impedance mismatch section of a differential transmission system. The transmission device includes: a differential driver; a differential receiver; a differential line that connects between the differential driver and the differential receiver, the differential line including in-phase signal wiring and inverted-phase signal wiring; a delay increasing structure interposed in the differential line at an upstream of the impedance mismatch section; and a delay increasing structure interposed at a downstream of the impedance mismatch section. The delay increasing structure is interposed only in one of the in-phase signal wiring and the inverted-phase signal wiring, and the delay increasing structure is interposed only in another of the in-phase signal wiring and the inverted-phase signal wiring.

4 Claims, 8 Drawing Sheets

TRANSMISSION DEVICE

TECHNICAL FIELD

The present invention relates to a transmission device using differential lines, and more particularly, to a novel circuit configuration for impedance match.

BACKGROUND ART

With the recent advances in performance of information processing systems, gigabit-per-second (Gbps) class serial signaling using a differential signal has been widespread. Such a higher-speed signal, however, leads to a noticeable waveform deterioration due to impedance mismatch (discontinuous structure).

Most of the high-speed serial transmission standards therefore require that reflection characteristics fall below a prescribed value in a wide frequency range.

In the case of a transmission device using differential lines, on the other hand, it is known that a parasitic inductance may be generated in a package or a module because wire bonding is used to connect a mounted chip to board wiring.

It is also known that a parasitic capacitance may be generated between the differential lines because an in-phase signal and an inverted-phase signal are often made in close proximity to each other in order to increase the signal density in a bump of a chip, a solder ball of a package, and a differential through hole in a PCB board.

As the signal frequency band becomes higher, the impedance mismatch due to those parasitic components becomes more noticeable to deteriorate the reflection characteristics. It has therefore become more difficult to satisfy a reflection prescribed value of the standards, which is one major problem.

In view of the above, the technology for achieving impedance match by a capacitance circuit and the technology of using an input/output terminal of an IC as an impedance transformer have hitherto been proposed as the countermeasure for the problem (see, for example, Patent Literature 1 and Patent Literature 2).

CITATION LIST

Patent Literature

[PTL 1] JP 05-37209 A
[PTL 2] JP 2010-206084 A

SUMMARY OF INVENTION

Technical Problem

The conventional transmission device has the following problem. According to the technologies described in Patent Literature 1 and Patent Literature 2, the technology for achieving impedance match and the design method therefor are originally derived from the technology for single-ended transmission, not assuming differential transmission. When applied to a differential transmission system, the conventional transmission device has been designed similarly to a general single-ended transmission system while imposing the symmetry condition on differential signals so that mode conversion may be prevented. An efficient technology cannot therefore be established for the differential transmission system.

The present invention has been made for solving the above-mentioned problem, and it is an object thereof to obtain a transmission device that establishes efficient match with an impedance mismatch section of a differential transmission system.

Solution to Problem

A transmission device according to one embodiment of the present invention includes: a differential driver; a differential receiver; a differential line that connects between the differential driver and the differential receiver, the differential line including in-phase signal wiring and inverted-phase signal wiring; a first delay increasing structure interposed in the differential line at an upstream of an impedance mismatch section; and a second delay increasing structure interposed at a downstream of the impedance mismatch section. The first delay increasing structure is interposed only in one of the in-phase signal wiring and the inverted-phase signal wiring, and the second delay increasing structure is interposed only in another of the in-phase signal wiring and the inverted-phase signal wiring.

Advantageous Effects of Invention

According to one embodiment of the present invention, the transmission characteristics can be improved and the reflection characteristics can be reduced in the impedance mismatch section on the differential lines.

DESCRIPTION OF EMBODIMENTS

First Embodiment

Figure 1:
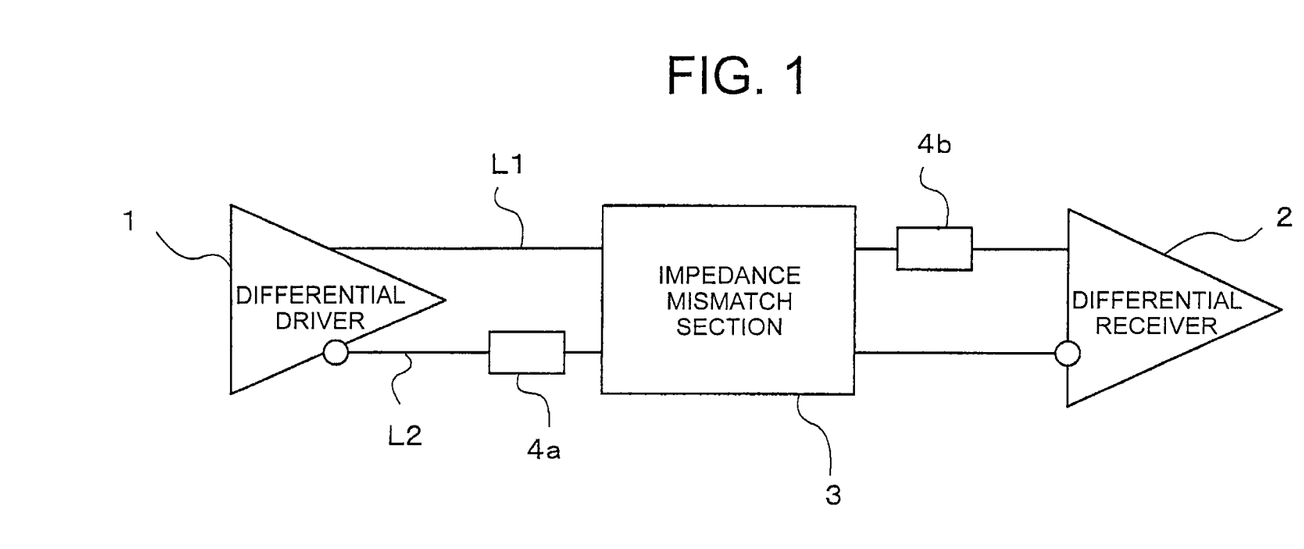
FIG. 1 is a block diagram illustrating a transmission device according to a first embodiment of the present invention.

FIG. 1 is a block diagram illustrating a transmission device according to a first embodiment of the present invention, schematically illustrating a circuit when a communication device is constructed.

In FIG. 1, the basic configuration of the transmission device (communication device) includes a differential driver 1 and a differential receiver 2.

The differential driver 1 and the differential receiver 2 are connected to each other by differential lines formed of in-phase signal wiring L1 and inverted-phase signal wiring L2 (two pieces of wiring), and differential signals are transmitted from the differential driver 1 toward the differential receiver 2.

An impedance mismatch section 3 is interposed in the middle of the differential lines between the differential driver 1 and the differential receiver 2.

Examples of the impedance mismatch section 3 include a wire bond in an IC chip, a bump of a chip, a solder ball of a package, a through hole in a PCB board, and a connector.

At the upstream of the impedance mismatch section 3 on the differential lines, a first delay increasing structure 4a (hereinafter sometimes referred to simply as "delay increasing structure 4a") for increasing a delay of only one of the in-phase signal wiring L1 and the inverted-phase signal wiring L2 (in this case, the inverted-phase signal wiring L2) is interposed.

At the downstream of the impedance mismatch section 3, a second delay increasing structure 4b (hereinafter sometimes referred to simply as "delay increasing structure 4b") is interposed in a line having the opposite polarity to the line for the upstream delay increasing structure (in this case, the in-phase signal wiring L1).

Next, a description is given of the circuit operation according to the first embodiment of the present invention illustrated in FIG. 1.

First, the differential signals output from the differential driver 1 are transmitted through the differential lines formed of the in-phase signal wiring L1 and the inverted-phase signal wiring L2 (two pieces of wiring) and are directed toward the impedance mismatch section 3.

In this case, because the delay increasing structure 4a is interposed at the upstream of the impedance mismatch section 3, a part of the differential signals are converted into common-mode signals and thereafter the signals enter the impedance mismatch section 3.

At this time, reflection occurs in the impedance mismatch section 3 because of the impedance mismatch, but a part of the reflected wave becomes a reflection component for the differential mode and another part becomes a reflection component for the common mode due to the delay increasing structure 4a.

In this manner, the reflected wave generated by the impedance mismatch section 3 is dispersed into the two modes, and hence the reflection component for the differential mode is reduced as compared to the case where the signals are all reflected as the differential mode.

Most of the standards of high-speed serial signaling define only the differential-mode reflection component with respect to a differential-mode signal input but do not define the common-mode reflection component with respect to the differential-mode signal input. Consequently, the effect that the standards are more easily satisfied can be obtained owing to the effect of reducing the differential-mode reflection component with respect to the differential-mode signal input.

Now consider the case where the impedance mismatch section 3 is undesired coupling between the differential lines.

Figure 2:
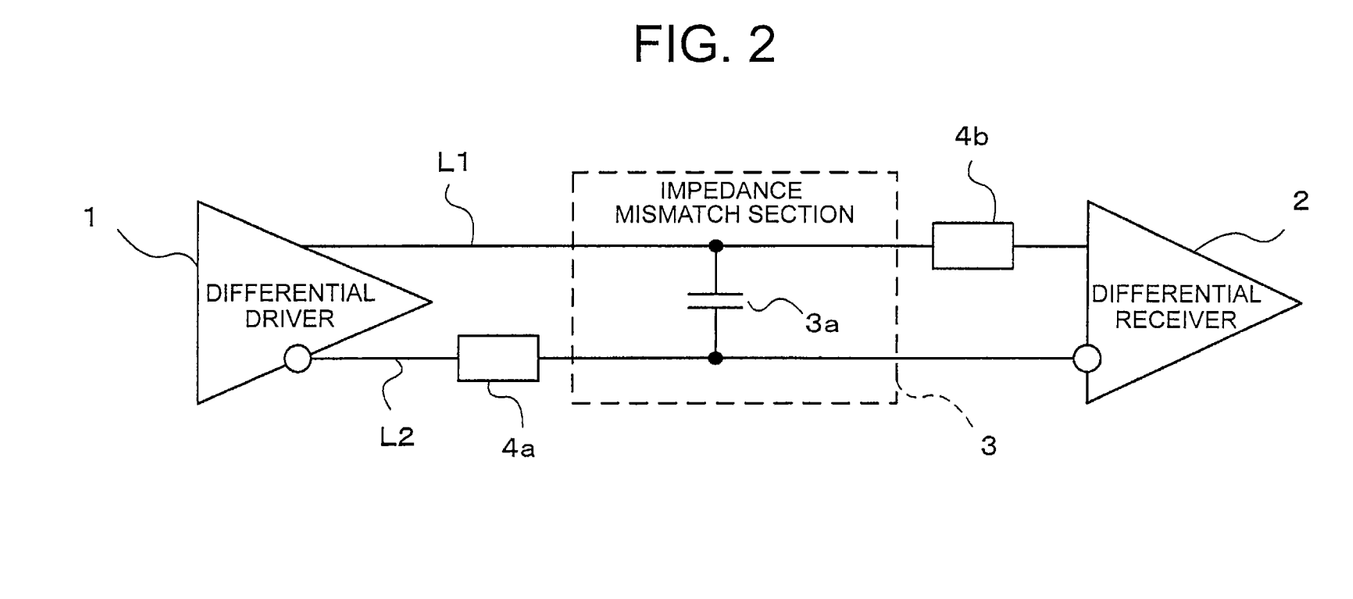
FIG. 2 is a block diagram illustrating an impedance mismatch section of FIG. 1 in the form of an equivalent circuit.

A description is now given of the case where the undesired coupling of the impedance mismatch section 3 is a differential capacitance 3a as exemplified by a circuit configuration example of FIG. 2.

FIG. 2 is a block diagram illustrating the impedance mismatch section 3 of FIG. 1 in the form of an equivalent circuit. The illustrated equivalent circuit corresponds to the case where the differential capacitance 3a (parasitic capacitance) is generated between the differential lines when an in-phase signal and an inverted-phase signal are made in proximity to each other in order to increase the signal density in a bump of a chip, a solder ball of a package, a differential through hole in a PCB board, or the like.

In FIG. 2, the delay increasing structure 4a is interposed at the upstream of the impedance mismatch section 3 (inverted-phase signal wiring L2), and hence at least a part of the signals are converted into the common mode and enter the impedance mismatch section 3.

When the delay increasing structure 4a is equal to the half-wave length of the signals, the signals are all converted into the common mode and enter the impedance mismatch section 3.

In this case, the common-mode signal is a mode in which the two pieces of wiring L1 and L2 constructing the differential lines change with the same potential, and hence the differential capacitance 3a is regarded as being absent equivalently. In other words, no reflection caused by the parasitic capacitance occurs and thus the transmission increases.

The signals that have passed through the impedance mismatch section 3 are converted into the differential mode again by the delay increasing structure 4b, which is interposed at the downstream of the impedance mismatch section 3 on the line having the opposite polarity to the line for the upstream delay increasing structure (in-phase signal wiring L1), and are input to the differential receiver 2.

Figure 3:
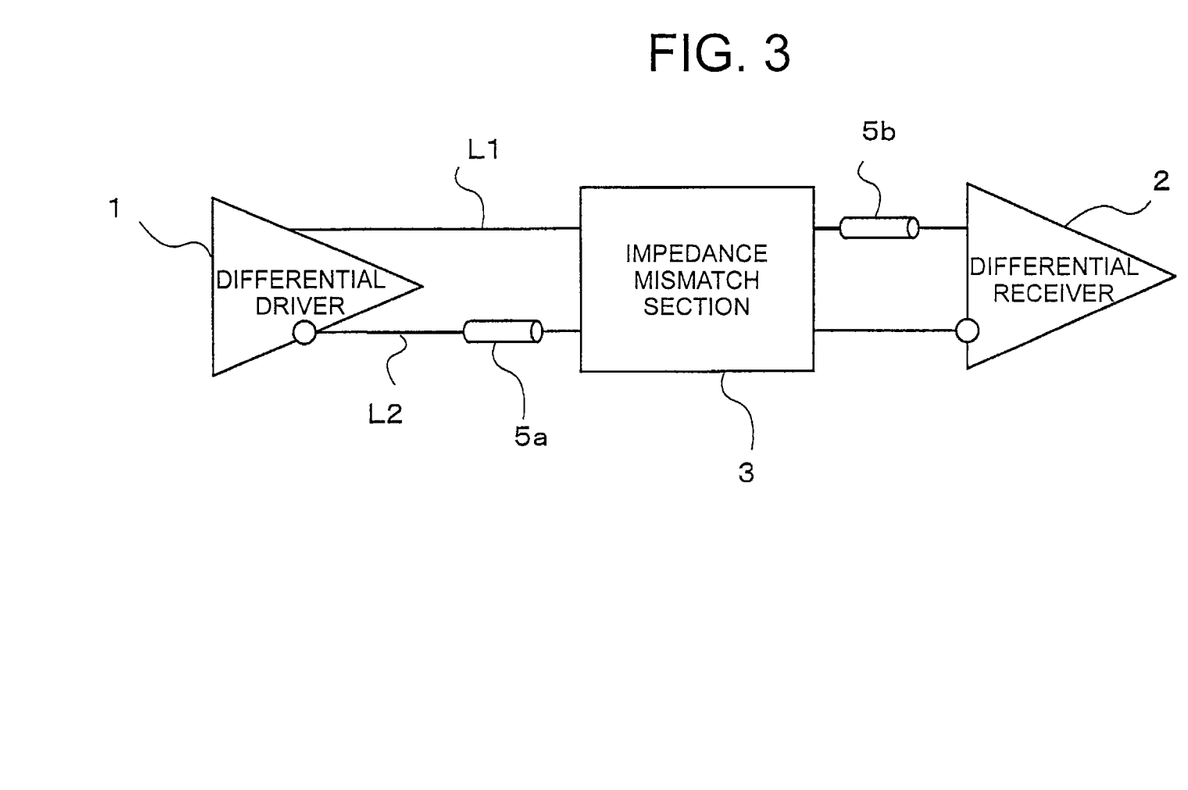
FIG. 3 is a block diagram when a delay increasing structure of FIG. 1 is constructed by a transmission line.
Figure 4:
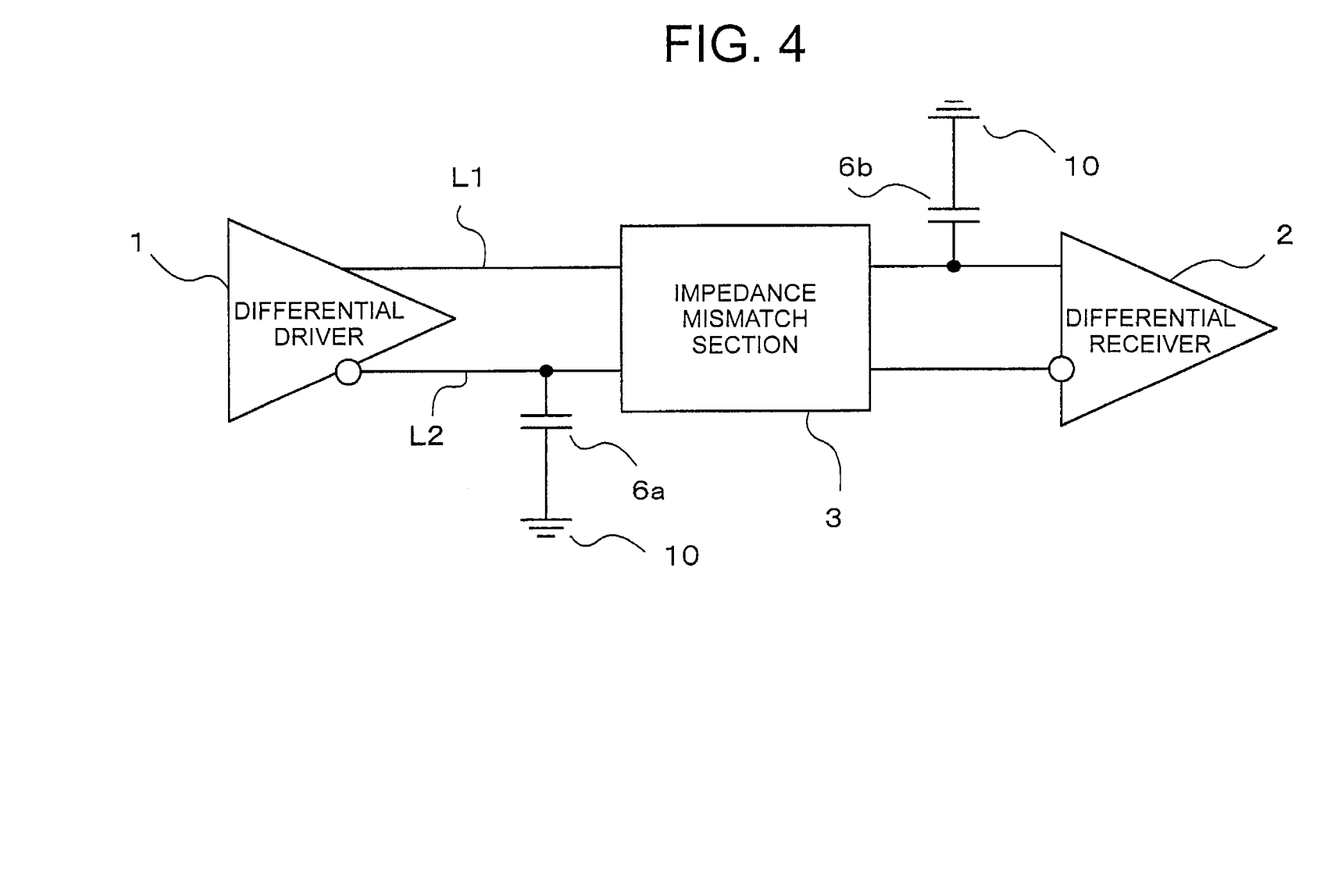
FIG. 4 is a block diagram when the delay increasing structure of FIG. 1 is constructed by a capacitor element.
Figure 5:
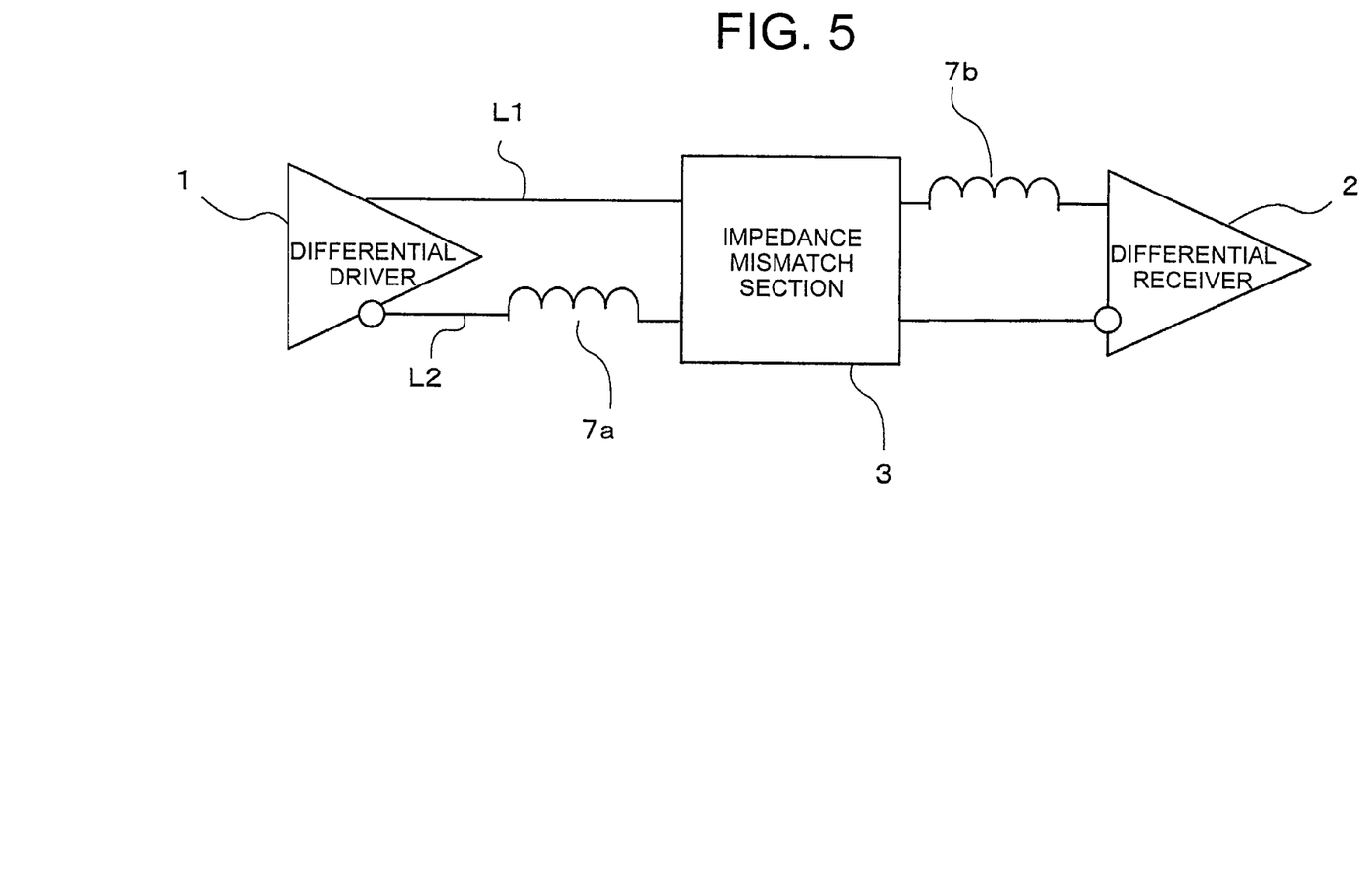
FIG. 5 is a block diagram when the delay increasing structure of FIG. 1 is constructed by an inductor element.

Note that, although the general delay increasing structures 4a and 4b have been described with reference to FIGS. 1 and 2, for example, the delay increasing structures may be constructed by transmission lines 5a and 5b as illustrated in FIG. 3, may be constructed by capacitor elements 6a and 6b connected to a GND 10 as illustrated in FIG. 4, and may be constructed by series inductor elements 7a and 7b as illustrated in FIG. 5.

It should be understood that FIGS. 3 to 5 may be combined, and, for example, the present invention is applicable also to a ladder circuit in which the plurality of capacitor elements 6a and 6b (FIG. 4) connected to the GND 10 and the plurality of series inductor elements 7a and 7b (FIG. 5) are arranged alternately.

Figure 6:
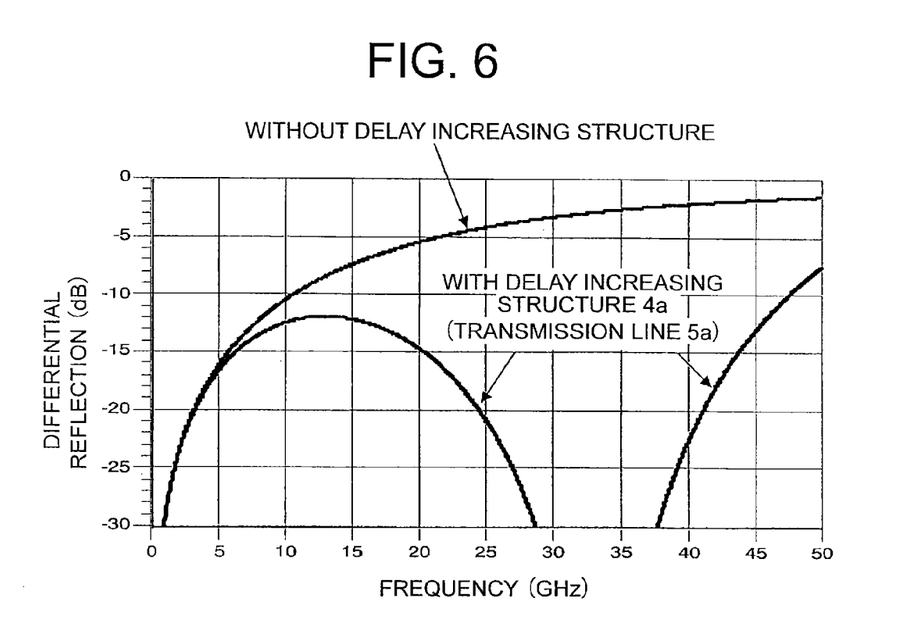
FIG. 6 is an explanatory graph showing a differential reflection reducing effect according to the first embodiment of the present invention in the form of simulation results in the configuration example of FIG. 3.
Figure 7:
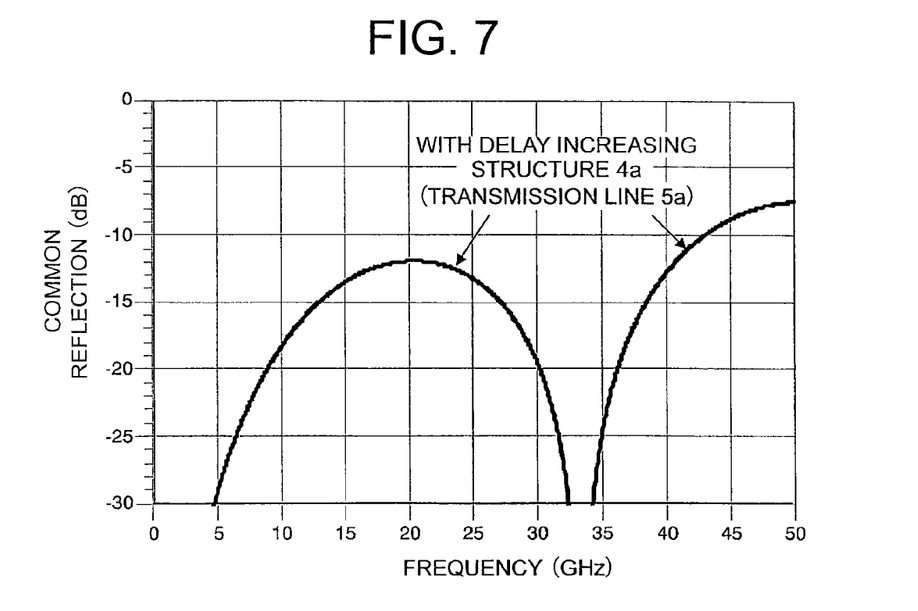
FIG. 7 is an explanatory graph showing common reflection characteristics according to the first embodiment of the present invention in the form of simulation results in the configuration example of FIG. 3.
Figure 8:
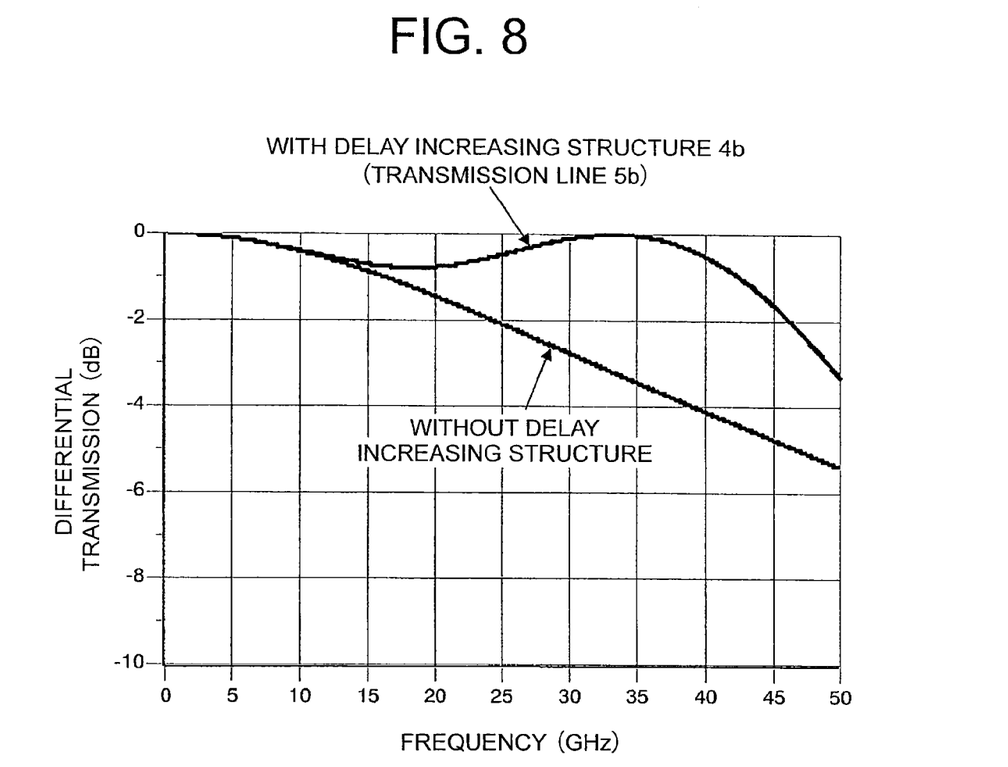
FIG. 8 is an explanatory graph showing a differential transmission increasing effect according to the first embodiment of the present invention in the form of simulation results in the configuration example of FIG. 3.

FIGS. 6, 7, and 8 are explanatory graphs showing the effects obtained by the first embodiment of the present invention, each showing the simulation result in the configuration example of FIG. 3 (the case where the delay increasing structures 4a and 4b are the transmission lines 5a and 5b).

FIG. 6 shows frequency characteristics when the signals are reflected in the differential mode, in which the horizontal axis represents the frequency (GHz) and the vertical axis represents the differential reflectance (dB).

FIG. 7 shows frequency characteristics when the signals are reflected in the common mode, in which the horizontal axis represents the frequency (GHz) and the vertical axis represents the common reflectance (dB).

FIG. 8 shows frequency characteristics when the signals are transmitted in the differential mode, in which the horizontal axis represents the frequency (GHz) and the vertical axis represents the differential transmission rate (dB).

In FIG. 6, it can be confirmed that the reflectance in the differential mode is suppressed by adding the delay increasing structure 4a (transmission line 5a) at the upstream as compared to the case where the delay increasing structure is not provided.

In FIG. 7, on the other hand, it can be confirmed that the reflectance in the common mode is increased by adding the delay increasing structure 4a (transmission line 5a) at the upstream as compared to the case where the delay increasing structure is not provided (−∞ dB). In other words, by converting the differential-mode signals temporarily into the common-mode signals, an influence reducing effect for the undesired coupling between the differential wirings can be obtained. Note that, even if the reflection in the common mode increases, the value thereof does not particularly deviate from the standards in most cases.

In FIG. 8, it can also be confirmed that the transmission characteristics in the differential mode become larger by adding the delay increasing structure 4b (transmission line 5b) at the downstream so that the signals are returned to the differential mode from the common mode as compared to the case where the delay increasing structure is not provided.

Note that, although the delay increasing structure 4a is interposed only in the inverted-phase signal wiring L2 at the upstream of the impedance mismatch section 3 and the delay increasing structure 4b is interposed only in the in-phase signal wiring L1 at the downstream of the impedance mismatch section 3 in FIGS. 1 to 5, the delay increasing structure 4a may be interposed only in the in-phase signal wiring L1 at the upstream of the impedance mismatch section 3 and the delay increasing structure 4b may be interposed only in the inverted-phase signal wiring L2 at the downstream of the impedance mismatch section 3 conversely.

As described above, the transmission device according to the first embodiment of the present invention (FIGS. 1 to 8) includes the differential driver 1, the differential receiver 2, the differential line that connects between the differential driver 1 and the differential receiver 2 and includes the in-phase signal wiring L1 and the inverted-phase signal wiring L2, the first delay increasing structure 4a interposed in the differential line at the upstream of the impedance mismatch section 3, and the second delay increasing structure 4b interposed at the downstream of the impedance mismatch section 3.

The first delay increasing structure 4a is interposed only in one of the in-phase signal wiring L1 and the inverted-phase signal wiring L2 (for example, the inverted-phase signal wiring L2), and the second delay increasing structure 4b is interposed only in the other of the in-phase signal wiring L1 and the inverted-phase signal wiring L2 (for example, the in-phase signal wiring L1).

The first and second delay increasing structures 4a and 4b respectively include the transmission lines 5a and 5b (FIG. 3), the capacitor elements 6a and 6b (FIG. 4), or the inductor elements 7a and 7b (FIG. 5), and can be constructed by a ladder circuit formed of the capacitor elements 6a and 6b and the inductor elements 7a and 7b.

In this manner, at the upstream of the impedance mismatch section 3, the reflection reducing effect (FIG. 6) in the differential mode owing to the dispersion of the reflected wave into the differential mode and the common mode and the influence reducing effect (FIG. 7) for undesired coupling between differential wirings (differential capacitance 3a) owing to temporary conversion of the differential-mode signal into the common mode can be obtained as the effects obtained by interposing the delay increasing structure 4a.

Further, at the downstream of the impedance mismatch section 3, the transmission increasing effect (FIG. 8) for the differential signal can be obtained as the effect obtained by interposing the delay increasing structure 4b.

Further, the delay increasing structures 4a and 4b are constructed by, for example, the transmission lines 5a and 5b (FIG. 3) or the like, and can therefore be realized at low cost.

Now, a specific description is given of the first effect (improvement on transmission characteristics and reflection characteristics).

When it is assumed that the impedance mismatch section 3 is, for example, the differential capacitance 3a (FIG. 2), a large reflection generally occurs with respect to a differential input at high frequency, but a part of the incident differential signals are converted into the common mode by the delay increasing structure 4a interposed in one wiring (inverted-phase signal wiring L2) at the upstream of the impedance mismatch section 3 (discontinuous structure) on the differential line.

For the common-mode signals, two differential signals have the same potential, and hence the differential capacitance 3a is regarded as being absent equivalently. Thus, no reflection occurs due to the parasitic capacitance and the transmission increases. The signals are further converted again from the common mode into the differential mode by the delay increasing structure 4b interposed at the downstream of the impedance mismatch section 3.

As a result, the effects that the transmission characteristics are improved and the reflection characteristics are reduced in the impedance mismatch section 3 on the differential lines can be obtained.

Now, a specific description is given of the second effect (satisfaction of the standards of high-speed serial signaling).

According to the first embodiment of the present invention, the delay increasing structure 4a (asymmetric structure) is interposed at the upstream of the impedance mismatch section 3 so that the differential mode and the common mode are coupled to each other, and hence, when the differential-mode enters, reflection involving the mode conversion occurs so that a part thereof is reflected as the differential mode and another part is reflected as the common mode.

In this manner, the reflected wave of the impedance mismatch section 3 is dispersed into the two modes, and hence the differential-mode reflection component with respect to the differential-mode signal input is reduced.

Most of the standards of high-speed serial signaling define only the differential-mode reflection component with respect to a differential-mode signal input but do not define the common-mode reflection component with respect to the differential-mode signal input. Consequently, the effect that the standards are more easily satisfied can be obtained owing to the effect of reducing the differential-mode reflection component with respect to the differential-mode signal input.

Owing to the first and second effects described above, the transmission characteristics are improved and the reflection characteristics are reduced with respect to the differential signals.

Second Embodiment

Figure 9:
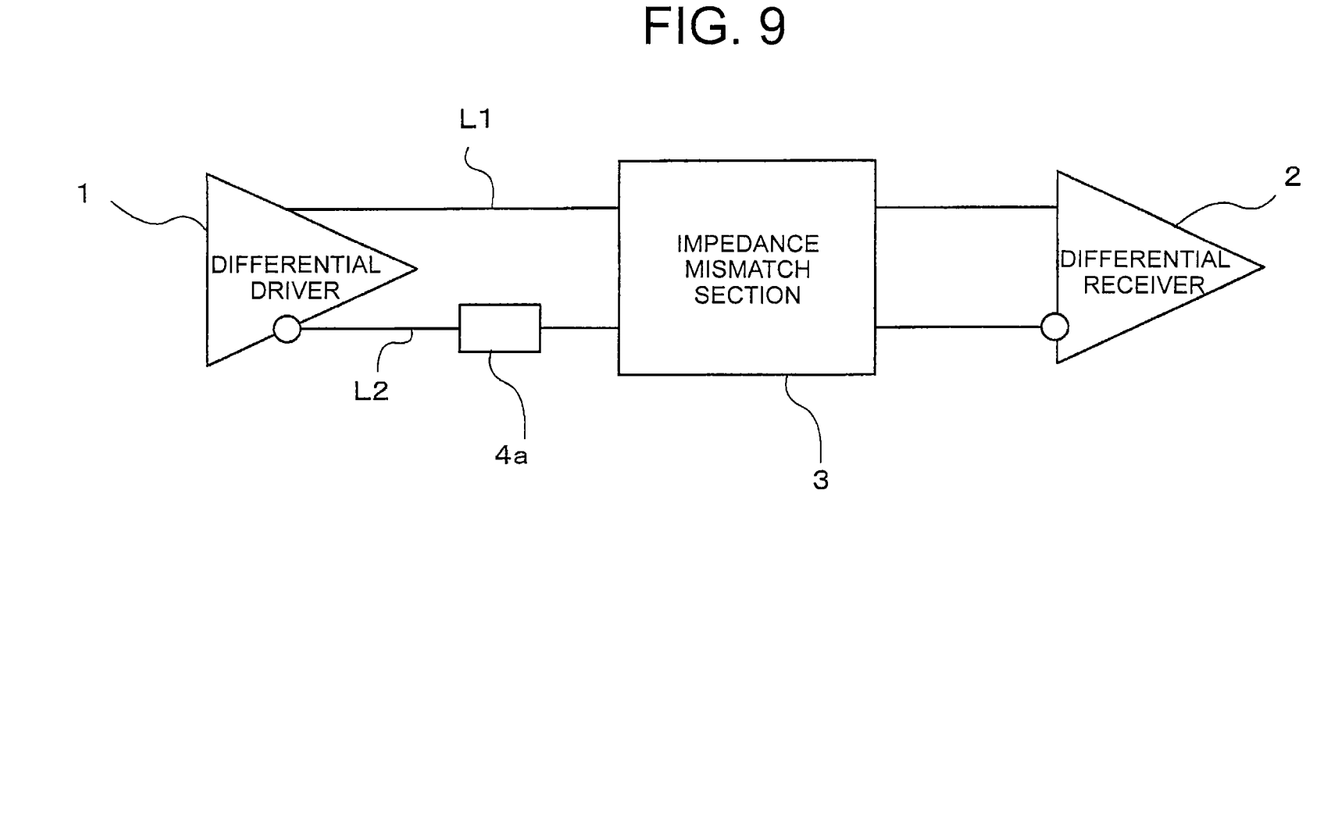
FIG. 9 is a block diagram illustrating a transmission device according to a second embodiment of the present invention.

Note that, although the first embodiment (FIGS. 1 to 5) improves the reflection characteristics by interposing the delay increasing structure 4a on the upstream side of the impedance mismatch section 3 and improves the transmission characteristics of the differential signals by interposing the delay increasing structure 4b also on the downstream side, only the delay increasing structure 4a on the upstream side of the impedance mismatch section 3 may be interposed to improve only the reflection characteristics as illustrated in FIG. 9.

FIG. 9 is a block diagram illustrating a transmission device according to a second embodiment of the present invention, schematically illustrating a circuit when a communication device is constructed similarly to the above (FIG. 1).

In FIG. 9, the same components as those described above (see FIG. 1) are denoted by the same reference symbols as those used above to omit the detailed descriptions thereof.

This case is different from the above in that only the delay increasing structure 4a is interposed on the upstream side of the impedance mismatch section 3 and that the delay increasing structure 4b (FIG. 1) on the downstream side is removed.

Also in this case, the delay increasing structure 4a is constructed by any one of the transmission line 5a (FIG. 3), the capacitor element 6a (FIG. 4), and the inductor element 7a (FIG. 5).

The circuit configuration of FIG. 9 can obtain the reflection reducing effect (FIG. 6) in the differential mode owing to the dispersion of the reflected wave into the differential mode and the common mode from among the effects according to the first embodiment.

Because the delay increasing structure 4b at the downstream is not present, there is another advantage that this circuit configuration is applicable even when the impedance mismatch section 3 is located immediately close to the differential receiver 2.

Note that, although the delay increasing structure 4a is interposed only in the inverted-phase signal wiring L2 at the upstream of the impedance mismatch section 3 in FIG. 9, the delay increasing structure 4a may be interposed only in the in-phase signal wiring L1.

REFERENCE SIGNS LIST 1 differential driver, 2 differential receiver, 3 impedance mismatch section, 3a differential capacitance, 4a, 4b delay increasing structure, 5a, 5b transmission line, 6a, 6b capacitor element, 7a, 7b inductor element, 10 GND, L1 in-phase signal wiring, L2 inverted-phase signal wiring

The invention claimed is:

1. A transmission device, comprising:
a differential driver;
a differential receiver;
a differential line that connects between the differential driver and the differential receiver, the differential line including in-phase signal wiring and inverted-phase signal wiring;
a first delay increasing structure interposed in the differential line upstream of an impedance mismatch section; and
a second delay increasing structure interposed downstream of the impedance mismatch section,
wherein the first delay increasing structure is interposed only in one of the in-phase signal wiring and the inverted-phase signal wiring, and
wherein the second delay increasing structure is interposed only in another of the in-phase signal wiring and the inverted-phase signal wiring.

2. A transmission device according to claim 1, wherein the first delay increasing structure and the second delay increasing structure comprise a transmission line.

3. A transmission device according to claim 1, wherein the first delay increasing structure and the second delay increasing structure comprise a capacitor element.

4. A transmission device according to claim 1, wherein the first delay increasing structure and the second delay increasing structure comprise an inductor element.

* * * * *